United States Patent
Schober et al.

(10) Patent No.: US 11,864,319 B2
(45) Date of Patent: Jan. 2, 2024

(54) Z-AXIS INTERCONNECTION WITH PROTRUDING COMPONENT

(71) Applicant: AT&S Austria Technologie & Systemtechnik Aktiengeschaft, Leoben (AT)

(72) Inventors: Mario Schober, Trofaiach (AT); Markus Leitgeb, Trofaiach (AT)

(73) Assignee: AT&S Austria Technologie &Systemtechnik AG, Leoben (AT)

( * ) Notice: Subject to any disclaimer, the term of this patent is extended or adjusted under 35 U.S.C. 154(b) by 0 days.

(21) Appl. No.: 16/656,392

(22) Filed: Oct. 17, 2019

(65) Prior Publication Data

US 2020/0128669 A1 Apr. 23, 2020

(30) Foreign Application Priority Data

Oct. 23, 2018 (EP) .................................. 18202076

(51) Int. Cl.
| | |
|---|---|
| H05K 1/14 | (2006.01) |
| H01L 25/18 | (2023.01) |
| H05K 1/02 | (2006.01) |
| H05K 1/18 | (2006.01) |

(52) U.S. Cl.
CPC ............ *H05K 1/144* (2013.01); *H01L 25/18* (2013.01); *H05K 1/023* (2013.01); *H05K 1/0274* (2013.01); *H05K 1/183* (2013.01); *H05K 2201/10378* (2013.01)

(58) Field of Classification Search
CPC ...... H05K 1/144; H05K 1/023; H05K 1/0274; H05K 1/183; H05K 2201/10378; H01L 25/18
USPC ........................................................ 361/761
See application file for complete search history.

(56) References Cited

U.S. PATENT DOCUMENTS

| | | | |
|---|---|---|---|
| 8,597,979 B1 | 12/2013 | Burgyan | |
| 9,129,958 B2* | 9/2015 | Mallik | ............. H01L 23/49816 |
| 9,167,694 B2 | 10/2015 | Sundaram et al. | |
| 2005/0265008 A1 | 12/2005 | Chamberlin et al. | |

(Continued)

FOREIGN PATENT DOCUMENTS

| | | |
|---|---|---|
| CN | 101989558 A | 3/2011 |
| DE | 112014003166 T5 | 10/2016 |

(Continued)

OTHER PUBLICATIONS

Extended European Search Report, Application 18202076.8; dated May 10, 2019; pp. 1-8; European Patent Office, 80298, Munich, Germany.

(Continued)

*Primary Examiner* — Tremesha S Willis
(74) *Attorney, Agent, or Firm* — Robert A. Blaha; Smith Tempel Blaha LLC (57) ABSTRACT

A component carrier includes a stack with at least one electrically insulating layer structure and/or at least one electrically conductive layer structure and a through hole. An interposer is located in the through hole and has a higher density of connection elements than the stack. A first component is mounted on a first main surface of the interposer (Continued)

and a second component is mounted on a second main surface of the interposer. The first component and the second component are connected via the interposer.

14 Claims, 4 Drawing Sheets

(56) References Cited

U.S. PATENT DOCUMENTS

| | | | |
|---|---|---|---|
| 2009/0145636 A1* | 6/2009 | Miki | H01L 23/315 |
| | | | 174/255 |
| 2010/0081236 A1 | 4/2010 | Yang et al. | |
| 2011/0024888 A1 | 2/2011 | Pagaila et al. | |
| 2011/0156239 A1 | 6/2011 | Jin | |
| 2011/0210444 A1 | 9/2011 | Jeng et al. | |
| 2014/0291818 A1 | 10/2014 | Zhao et al. | |
| 2015/0187608 A1 | 7/2015 | Ganesan et al. | |
| 2016/0118332 A1 | 4/2016 | Lin | |
| 2016/0276307 A1 | 9/2016 | Lin | |
| 2016/0300797 A1 | 10/2016 | Shim et al. | |
| 2016/0300817 A1 | 10/2016 | Do et al. | |
| 2017/0133353 A1 | 5/2017 | Lin et al. | |
| 2017/0202083 A1 | 7/2017 | Baek et al. | |

FOREIGN PATENT DOCUMENTS

| | | |
|---|---|---|
| EP | 3 288 076 A1 | 8/2016 |
| WO | 2015079551 A1 | 6/2015 |
| WO | 2016081182 A1 | 5/2016 |
| WO | 2016099446 A1 | 6/2016 |

OTHER PUBLICATIONS

Deconinck, E.; Communication Pursuant to Article 94(3) EPC in Application No. 18202076.8; pp. 1-5; dated Oct. 28, 2021; European Patent Office; Psotbus 5818, 2280 HV Rijswijk, Netherlands.
Office Action in China Patent Application No. 201911004970.8; pp. 1-7; dated Jul. 29, 2022; China National Intellectual Property Administration, No. 6, Xitucheng Lu, Jimenqiao Haidian District, 100088; Beijing City; China.
English translation of the cover pages of the Office Action in China Patent Application No. 201911004970.8; pp. 1-3; dated Jul. 29, 2022; China National Intellectual Property Administration, No. 6, Xitucheng Lu, Jimenqiao Haidian District, 100088; Beijing City, China.

* cited by examiner

Z-AXIS INTERCONNECTION WITH PROTRUDING COMPONENT

CROSS-REFERENCE TO RELATED APPLICATION

This application claims the benefit of the filing date of European Patent Application No. EP 18202076.8 filed Oct. 23, 2018, the disclosure of which is hereby incorporated herein by reference.

TECHNICAL FIELD

Embodiments of the present invention generally relate to a component carrier having a stack with a through hole and an interposer within the through hole. Furthermore, the invention relates to a method of manufacturing the component carrier and to an electronic device comprising the component carrier.

Technological Background

The increase of the intrinsic switching speeds or the higher transfer rates in the field of integrated circuits make it necessary to arrange a processor and a memory as close as possible to each other, because this will make high transfer rates possible and minimize the risk of data loss. In addition, a balanced heat management in the package is necessary for the greatest possible computing power from the active components. In addition, the smallest possible pitch between a package and a mainboard required may be limited by the height of the package soldering depot which leads to a limitation in the smallest possible thickness.

A component carrier, such as a printed circuit board (PCB) or a substrate, mechanically supports and electrically connects active and passive electronic components. Electronic components are mounted on the component carrier and are interconnected to form a working circuit or electronic assembly.

Component carriers can be single-sided or double-sided component carriers or can have a multi-layer design. Advantageously, multi-layer component carriers allow a high component density which becomes nowadays, in times of an ongoing miniaturization of electronic components, more and more important. Conventional component carriers known from the state of the art comprise a laminated stack with a plurality of electrically insulating layer structures and a plurality of electrically conductive layer structures. The electrically conductive layers are usually connected to each other by so called microvias or plated-through holes. A conductive copper layer on the surface of the laminated stack forms an exposed structured copper surface. The exposed structured copper surface of the laminated stack is usually covered with a surface finish which completely covers the exposed structured copper surface.

SUMMARY

There may be a need for flat component carriers comprising an effective signal processing and a proper heat management.

This need may be met by the subject matter according to the independent claims. Advantageous embodiments of the present invention are described by the dependent claims.

According to a first aspect a component carrier is presented. The component carrier comprises a stack having at least one electrically insulating layer structure and/or at least one electrically conductive layer structure and having a through hole. The component carrier further comprises an interposer in the through hole, wherein the interposer has a higher density of connection elements than the stack. The component carrier further comprises a first (active or passive) component mounted on a first main surface of the interposer and a second (active or passive) component mounted on a second main surface of the interposer and being connected to the first (active or passive) component via the interposer.

According to a further aspect, a method of manufacturing a component carrier is presented. According to the method, a stack is provided comprising at least one electrically insulating layer structure and/or at least one electrically conductive layer structure with a through hole. An interposer having a higher density of connection elements than the stack is arranged in the through hole. A first component is mounted on a first main surface of the interposer and a second component is mounted on a second main surface of the interposer to thereby connect the second component with the first component via the interposer.

According to a further aspect of the present invention an electric device is presented comprising a support structure, in particular a printed circuit board and an above described component carrier mounted on the support structure. According to an exemplary embodiment of the electric device, the support structure comprises a support main surface, wherein the component carrier is mounted to the support structure such that the first main surface of the component carrier is parallel with the support main surface.

Overview of Embodiments

In the context of the present application, the term "component carrier" may particularly denote any support structure which is capable of accommodating components thereon and/or therein for providing mechanical support and/or electrical connectivity. In other words, a component carrier may be configured as a mechanical and/or electronic carrier for active and passive components. In particular, a component carrier may be one of a printed circuit board, an organic interposer, and an IC (integrated circuit) substrate. A component carrier may also be a hybrid board combining different ones of the above-mentioned types of component carriers.

The component carrier comprises the stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane. In the context of the present invention, the term "layer structure" may be a single layer or multilayer assembly.

Active components may be defined as a component which rely on a source of energy (e.g. from a DC circuit) and usually may inject power into a circuit. Active components may include amplifying components such as transistors, triode vacuum tubes (valves), and tunnel diodes. Active components may be for example semiconductors, diodes, transistors, integrated circuits (ICs), optoelectronic devices, display technologies or kind of power sources.

Components incapable of controlling current by means of another electrical signal are called passive components. Resistors, capacitors, inductors, and transformers are considered as passive components. Passive components may e.g. not introduce net energy into the circuit. Passive components may not rely on a source of power, except for what is available from a circuit they are connected to. As a consequence, passive components may not amplify (increase a power of a signal), although they may increase a voltage or current (such as is done by a transformer or resonant circuit). Passive components include two-terminal components such as resistors, capacitors, inductors, and transformers.

According to an exemplary embodiment, at least one of the first component and the second component is an active component.

The interposer comprises the first main surface and the second main surface which differs to the first main surface. In particular, the first main surface and the second main surface form opposing surfaces of the interposer. For example, the first main surface is adapted for being mounted to the first component. The second main surface of the interposer, which may be a surface opposed to the first main surface, is adapted for being mounted to the second component by contacts.

The interposer comprises connection elements, wherein the connection elements connect the first component with the second component for signal transmission. Therefore, the connection elements may be copper structures for providing an electrical connection or optical connection elements for transmitting signals/information via optical transmission.

The interposer connection elements may be aligned along the z-axis (e.g. the vertical axis) of the interposer. Furthermore, the interposer may comprise connection elements being aligned along the x- or y-axis and therefor running within the xy-plane (e.g. the horizontal plane).

The interposer is arranged within the through hole in the stack. The section of the stack surrounding the interposer and the through hole respectively, may comprise further connection elements, such as vias or other contact paths, for providing a connection between opposing main surfaces of the stack or between the stack and one of the first components and/or the second components.

Specifically, the interposer has a higher density of connection elements than the connection elements of the stack. The density of connection elements may be defined by interposer connection elements per predefined direction (x-, y- or z-axis direction), volume unit or area unit of the interposer in comparison to stack connection elements per volume unit or area unit of the stack. The predefined direction may be the distance between two opposing edges, side surfaces or respective main surfaces of the interposer and the stack, respectively. The area unit may be a cross section of the interposer and the stack, respectively. The volume unit may be the volume of the interposer and the stack, respectively.

In an exemplary embodiment, the predefined direction, the volume unit or area unit of the interposer having the lowest density comprises more interposer connection elements per predefined direction, volume unit or area unit than the predefined direction, volume unit or area unit of the stack having the highest density of stack connection elements per predefined direction, volume unit or area unit, respectively.

Hence, the interposer forms a high density (HD) block comprising a high density of connection elements for providing a signal transmission between two components. The high density block may be a glass, organic or silicon interposer. The section of the stack surrounding the interposer may comprise a lower density of connection elements. The connection elements in the section of the stack surrounding the interposer may be used for power supply and may therefore comprise respective optimized (copper) geometries of the connection elements (e.g. connection element width in comparison to its length within the stack). Furthermore, further active or passive components may be embedded/integrated within the stack surrounding the interposer.

In conventional approaches, the first active component is formed on a further structure, such as a printed circuit board (PCB). After mounting the component carrier with a second active component to the PCB, the second active component is connected to the first active component. Hence, in order to mount the active component to the PCB, the PCB itself has to be adapted and prepared.

However, according to the approach of the present invention, all (in particular active) components are mounted to one common component carrier, such that the base structure, such as the PCB, has not to be amended and specifically prepared. No cut out or cavity is necessary to be formed in the PCB. Therefore, e.g. standardized PCBs can be used.

Furthermore, due to the arrangement of the first component within the cavity, the height and the pitch, respectively, of an overall package can be reduced. Therefore, for example the necessary stand-off function of solder balls for the mounting of substrates of the PCB can be reduced. This leads to an increase of I/Os (input/output) by having the same available area or to a reduction of the footprints having the same available area. Furthermore, because all component can be mounted to the component carrier, the common chip-last technology can be performed, because the component carrier as well as the components mounted thereon can be tested comprehensively before being mounted to a base structure.

Additionally, by mounting the first component and a second component to one common component carrier, both components can be mounted closer to each other such that the signal path can be shortened and the signals can be transmitted faster.

Furthermore, by integrating the interposer (e.g. made of silicon or ceramic) comprising the interposer connection elements (functioning as a through silicon via (TSV)) in the through hole of the stack, a large via density can be achieved. Furthermore, the interposer (made of silicon or ceramics) may be formed with a smaller (vertical) thickness than the surrounding stack (e.g. the laminated stack), so that the distance between the first component and the second component can be reduced so that a faster and more error free data/signal connection between the first and second component can be achieved.

According to a further exemplary embodiment, the second component is also mounted partially on a first main surface of the stack.

The stack comprises a first main surface and a second main surface which differs to the first main surface. In particular, the first main surface and the second main surface form opposing surfaces of the stack. For example, the first main surface is adapted for being mounted to a further structure, such as a support structure, in particular a printed circuit board. The second surface, which may be a surface opposed to the first main surface, may face the environment in order to dissipate heat, for example.

The first main surface and/or the second main surface may be formed by a structured electrically conductive layer structure of the stack. Accordingly, electrical contact, such as contact pads or solder balls for example, may be formed on the first main surface and/or second main surface of the stack.

The second component may form a top chip (e.g. a processor or APU) and extend over the edges of the interposer and extend over the section (main surface) of the stack surrounding the interposer. Hence, a further connection (electrical or optical) between the respective component and the respective main surface of the stack may be provided. Furthermore, in the section of the stack surrounding the interposer, the stack may comprise damping materials, for example elastic materials, for reducing mechanical stress in the component carrier.

According to a further exemplary embodiment, the section of the stack surrounding the interposer comprises further stack connection elements between a first main surface of the stack and a second main surface of the stack, in particular to provide electric power supply via the further stack connection elements. Hence, an electrically conductive connection with an electronic periphery of the component carrier can be provided. In particular, an electric connection with an electric power supply can be formed. Furthermore, the further stack connection elements may connect e.g. the second component with other components, e.g. for providing an electric power supply.

According to a further exemplary embodiment, the first component is only mounted on the interposer without being mounted on the stack. Specifically, the first component may be arranged within a cavity formed in the first main surface of the stack.

According to a further exemplary embodiment of the component carrier at least one of the connection elements is an electric connection element, in particular a copper structure. By providing a copper structure, the thermal behavior as well as the shielding capability may be improved.

According to a further exemplary embodiment of the component carrier at least one of the connection elements is an optical connection element, in particular an optical fiber or a light guide. The optical connection elements transmit signals/information via optical transmission. In a further exemplary embodiment the interposer may comprise both, optical connection elements and copper structures.

According to a further exemplary embodiment, the interposer has a higher density of connection elements than connection elements of the stack in z-direction.

The stack and its first and second main surface as well as the interposer and its first and second main surface extend within respective xy-planes. The z-direction is the direction of the normal of the respective xy-planes. Specifically, the z-direction defines a vertical direction of the stack. In particular, the vertical direction is the stacking direction of the stack of the component carrier. Hence, along the stacking direction the layers of the electrical insulating structures and the electrically conductive structures are stacked. Specifically, the height and the thickness, respectively, of the component carrier is defined along the second direction.

As described above, the density of interposer connection elements aligned in z-direction may be defined by interposer vertical connection elements per predefined direction (e.g. x- or y-axis), volume unit or area unit (e.g. xy-plane) of the interposer in comparison to vertical stack connection elements per predefined direction (e.g. x- or y-axis), volume unit or area unit (e.g. xy-plane) of the stack. The interposer connection elements connect a first component and the second component. Specifically, the interposer connection element extends along a vertical direction (along the z-axis) of the interposer but may also have horizontal sections running at least partially within the xy-plane.

According to the above described exemplary embodiment, it is defined, that the interposer connection elements in vertical direction have a higher density than respective vertical connection elements of the stack in vertical direction.

The predefined direction, volume unit or area unit of the interposer having the lowest amount of respective vertical interposer connection elements comprises more connection elements than the respective predefined direction, the volume unit or area unit of the stack having the highest amount of vertical stack connection elements per respective predefined direction, volume unit or area unit, respectively.

According to an exemplary embodiment, the interposer has a higher density of connection elements than connection elements of the stack in the xy-plane. Hence, connection elements (or at least sections thereof) of the interposer and the stack may extend along the xy-plane. The density of the stack connection elements of the stack in the xy-plane is lower than the density of the interposer connection elements of the interposer extending in the xy-plane.

The predefined direction, volume unit or area unit of the interposer having the lowest amount of respective horizontal interposer connection elements comprises more connection elements than the respective predefined direction, the volume unit or area unit of the stack having the highest amount of horizontal stack connection elements per respective predefined direction, volume unit or area unit, respectively.

According to a further exemplary embodiment, the first component and the second component collaborate functionally. Hence, in addition to an electrical connection between the first component and the second component, the term "collaborate functionally" means that the first component and the second component are functionally dependent on each other. For example, the second component may be a processor and the first component a memory which is accessible by the processor. Hence, the first component and the second component as coupled form a functional unit in which both components collaborate functionally.

According to a further exemplary embodiment, wherein the at least one of the first component and second component is a semiconductor chip.

According to a further exemplary embodiment, the first component is a memory and the second component is a processor. Hence, by the present invention the processor and the memory are mounted to one common interposer of a component carrier instead of separate packages onto a base structure, e.g. a mainboard. By mounting the memory and the processor separately to the main board, longer transmitting paths for the signals are necessary because the signals had to be transmitted via the main port. Hence, by providing the memory on the first interposer main surface and additionally by providing the processor on the second interposer main surface, the memory and the processor and hence also the component carrier and the mainboard can be placed closer to each other. Additionally, the solder depot which is necessary for the connection can be formed smaller such that a smaller pitch (z-axis thickness) between the component carrier (package) and the mainboard forming the base structure can be provided.

According to a further exemplary embodiment, the interposer is manufactured based on glass, silicon, ceramic or organic materials.

Specifically, if the interposer is manufactured based on silicon and if the stack is formed with FR4 material for the electrically insulting layer structure, both advantages of the materials can be combined. The stack made of FR4 is temperature resistant and comprises a high electric strength of more than e.g. 20 kV/mm so that the FR4 material in the stack promotes the connection elements for power supply, whereas the connection elements in the silicon interposer promotes faster signal transmission.

According to a further exemplary embodiment, the first component and/or the second component is embedded (i.e. integrated) in a cavity defined by the stack in the interposer. For example, the respective main surface of the interposer is recessed with respect to the surrounding outer layer(s) of the respective layers of the stack. Hence, the respective component arranged in the cavity may be surrounded along its edges by respective layers of the stack.

The cavity forms a recess with respect to the surface of the first main surface of the stack surrounding the cavity. The cavity is formed in such a way, that the first component can be placed inside the cavity. The first component may protrude outside of the cavity with respect to the stack main surface surrounding the cavity. However, according to an exemplary embodiment, the cavity is formed in such a way, that the respective component does not protrude from the stack main surface surrounding the cavity. In other words, the surface surrounding the cavity is formed within a plane, wherein the respective component does not protrude from the cavity through the plane.

According to an exemplary embodiment, the interposer comprises a cavity along its respective main surface, such that the respective component may be placed inside the cavity.

According to a further exemplary embodiment, at least one further active and/or passive component is surface-mounted on and/or embedded/integrated in the stack and/or the interposer.

According to a further exemplary embodiment, the further active and/or passive component is configured for collaborating functionally with at least the one of the first component and the second component.

According to a further exemplary embodiment, the first component comprises a first component main surface, wherein the first component is mounted to the interposer such that the first component main surface is parallel with respect to the first main surface of the interposer. Additionally or alternatively, the second component comprises a second component main surface, wherein the second component is mounted to the interposer such that the second component main surface is parallel with respect to the second main surface of the interposer.

The first and second component may comprise, respectively, two opposing component main surfaces. For example, the one component main surface is adapted for being mounted to a further structure, such as the interposer or a support structure, in particular a printed circuit board. The other opposing component main surface, may face the environment in order to dissipate heat or may be connected to another stack or interposer, for example. The components may comprise at the respective component main surfaces electrical connections for receiving or transmitting signals or power. The respective component main surfaces may be formed by a structured electrically conductive layer structure of the interposer. Accordingly, electrical contact, such as contact pads or solder balls for example, may be formed on the respective component main surfaces.

The main surfaces of the stack and the interposer as well as the respective component main surfaces extend within respective parallel xy-planes. The z-direction is the direction of the normal of the respective xy-planes. Specifically, the z-direction defines a vertical direction of the stack, the interposer and the component. According to exemplary embodiment, the respective component main surface may be parallel with respect to the respective main surface of the interposer to which the respective component is mounted.

According to a further exemplary embodiment, the first component comprises a first component main surface, wherein the second component comprises a second component main surface. The first component and the second component are mounted to the interposer such that the first component main surface is parallel with respect to the second component main surface.

According to a further exemplary embodiment of the electrical device, the support structure comprises a support main surface, wherein the component carrier is mounted to the support structure such that the first main surface of the component carrier is parallel with the support main surface. The first main surface of the component carrier of the stack may be indicative to the first main surface of the stack and parallel to the support main surface. The support main surface may comprise electrical connections for signal and power transmission in order to provide a connection with respective electrical contacts of the first main surface of the stack.

According to a further exemplary embodiment, the at least one electrically conductive layer structure comprises at least one of the group consisting of copper, aluminum, nickel, silver, gold, palladium, and tungsten, any of the mentioned materials being optionally coated with supra-conductive material such as graphene.

According to a further exemplary embodiment, the at least one electrically insulating layer structure comprises at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide.

According to a further exemplary embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an exemplary embodiment, the component carrier is configured as one of the group consisting of a printed circuit board, and a substrate (in particular an IC substrate). In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF ILLUSTRATED EMBODIMENTS

The illustrations in the drawings are schematically presented. It is noted that in different figures, similar or identical elements or features are provided with the same reference signs or with reference signs, which are different from the corresponding reference signs only within the first digit. In order to avoid unnecessary repetitions elements or features which have already been elucidated with respect to a previously described embodiment are not elucidated again at a later position of the description.

Further, spatially relative terms, such as "front" and "back", "above" and "below", "left" and "right", et cetera are used to describe an element's relationship to another element or elements as illustrated in the figures. Thus, the spatially relative terms may apply to orientations in use which differ from the orientation depicted in the figures. Obviously, all such spatially relative terms refer to the orientation shown in the figures only for ease of description and are not necessarily limiting as an apparatus according to an embodiment of the invention can assume orientations different than those illustrated in the figures when in use.

Figure 1:
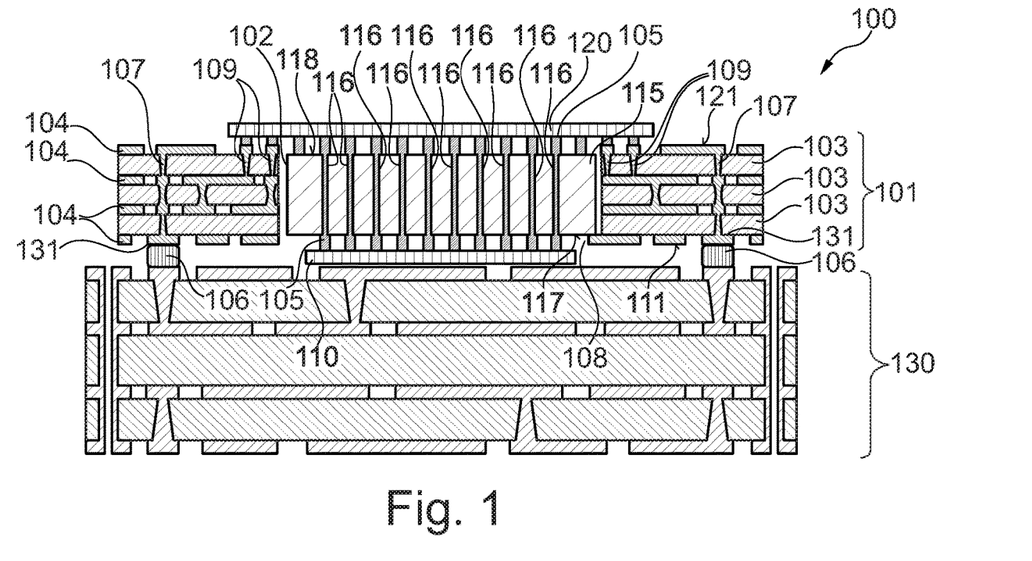
FIG. 1 illustrates a component carrier mounted to a support structure according to an exemplary embodiment of the present invention.

FIG. 1 shows an electric device comprising a support structure 130, in particular a printed circuit board and a component carrier 100 mounted on the support structure 130. The component carrier 100 comprises a stack 101 comprising at least one electrically insulating layer structure 103 and/or at least one electrically conductive layer structure 104 and having a through hole 102. The component carrier 100 further comprises an interposer 115 in the through hole 102, wherein the interposer 115 has a higher density of connection elements 116 than the stack 101. The component carrier 100 further comprises a first active or passive component 110 mounted on a first main surface 117 of the interposer 115 and a second active or passive component 120 mounted on a second main surface 118 of the interposer 115 and being connected to the first active component 110 via the interposer 115 and its connection elements 116, respectively. In the shown exemplary embodiment, the first component 110 and the second component 120 may be active components.

The component carrier 100 is a support structure which is capable of accommodating the interposer 115 and active components 110, 120 thereon and/or therein for providing mechanical support and/or electrical connectivity. The component carrier 100 is configured as a mechanical and/or electronic carrier for the interposer 115 and active and passive components 110, 120, 1001 (see FIG. 10). In particular, a component carrier 100 may be one of a printed circuit board, an organic interposer, and an IC (integrated circuit) substrate. A component carrier 100 may also be a hybrid board combining different ones of the above-mentioned types of component carriers.

The component carrier 100 comprises the stack of at least one electrically insulating layer structure 103 and at least one electrically conductive layer structure 104. The component carrier 100 is in particular a laminate of the mentioned electrically insulating layer structure(s) 103 and electrically conductive layer structure(s) 104, in particular formed by applying mechanical pressure, if desired supported by thermal energy. The mentioned stack 101 may provide a plate-shaped component carrier 100 capable of providing a large mounting surface 111, 121 for the active components 110, 120 and being nevertheless very thin and compact.

The stack 101 comprises a first main surface 111 and the second main surface 121 which may differ to the first main surface 111. In particular, the first main surface 111 and the second main surface 121 form opposing surfaces of the stack 101. For example, the first main surface 111 is adapted for being mounted to the support structure 130, in particular a printed circuit board. The second surface 121, which may be a surface opposed to the first main surface 111, may face the environment in order to dissipate heat, for example.

The first main surface 111 and/or the second main surface 121 may be formed by a structured electrically conductive layer structure 104 of the stack 101. Accordingly, electrical contact, such as stack connection 109 131 or solder balls 106 for example, may be formed on the first main surface 111 and/or second main surface 121.

The interposer 115 comprises the first main surface 117 and the second main surface 118 which differs to the first main surface 117. In particular, the first main surface 117 and the second main surface 118 form opposing surfaces of the interposer 115. For example, the first main surface 117 is adapted for being mounted to the first active component 110 by contacts 105. The second main surface 118 of the interposer 115, which may be a surface opposed to the first main surface 117, is adapted for being mounted to the second active component 120 by contacts 105.

The interposer 115 comprises connection elements 116, wherein the connection elements 116 connect the first active component 110 with the second active component 120 for signal transmission. Therefore, the connection elements 116 may be copper structures for providing an electrical connection or optical connection elements for transmitting signals/information via optical transmission.

The interposer 115 is arranged within the through hole 102 in the stack 101. The section of the stack 101 surrounding the interposer 115 and the through hole 102, respectively, may comprise further connection elements, such as vias 107 through the stack 101 or other contact paths, for providing a connection between opposing main surfaces of the stack. Furthermore, connections 109 between the between the stack 101 and one of the first active components 120 and/or the second active components 120 are provided.

Specifically, the interposer 115 has a higher density of connection elements 116 than the connection elements (e.g. the connection 109 to stack 101 and/or the vias 107) of the stack 101. The density of connection elements may be defined by interposer connection elements 116 per predefined volume unit or area unit of the interposer 115 in comparison to stack connection elements 107, 109 per volume unit or area unit of the stack 101. In an exemplary embodiment, the volume unit or area unit of the interposer 115 having the lowest density comprises more interposer connection elements 116 per volume unit or area unit than the volume unit or area unit of the stack 101 having the highest density of stack connection elements 107, 109 per volume unit or area unit, respectively.

The predefined direction, volume unit or area unit of the interposer 115 having the lowest amount of respective vertical interposer connection elements 116 comprises more connection elements than the respective predefined direction, the volume unit or area unit of the stack having the highest amount of vertical stack connection elements 107, 109 per respective predefined direction, volume unit or area unit, respectively.

Hence, the interposer 115 forms a high density (HD) block comprising a high density of connection elements 116 for providing a signal transmission between two active components 110, 120. The high density block may be a glass, ceramic, organic or silicon interposer 115. The section of the stack 101 surrounding the interposer 115 comprises a lower density of connection elements 107, 109. The connection elements 107, 109 in the section of the stack 101 surrounding the interposer 115 may be used for power supply and may therefore comprise respective optimized (copper) geometries of the connection elements 107, 109 (e.g. connection element width in comparison to its length within the stack). The connection elements 107, 109 may also be used for heat management and shielding purposes.

The second active component 120 is also mounted partially on a first main surface 121 of the stack and connected with connection 109 to stack 101 with respective electrically conductive layer structures 104.

The first main surface 111 of the stack 101 is adapted for being mounted to a support structure 130. The second main surface 121 of the stack, which may be a surface opposed to the first main surface 111, may face the environment in order to dissipate heat, for example.

The first main surface 111 and/or the second main surface 121 of the stack 101 are formed by a structured electrically conductive layer structure 104 of the stack 101. Accordingly, electrical contact, such as connections 109, pads 131 or solder balls 106 for example, may be formed on the first main surface 111 and/or second main surface 121 of the stack 101.

The second active component 120 may form a top chip (e.g. a processor or APU) and extend over the edges of the interposer 115 and extend over the section (main surface 121) of the stack 101 surrounding the interposer 115. Hence, a further connection 109 (electrical or optical) between the second active component 120 and the respective main surface 121 of the stack 101 may be provided.

The section of the stack 101 surrounding the interposer 115 comprises further stack connection elements, i.e. vias 107, between a first main surface 111 of the stack and a second main surface 121 of the stack 101, in particular to provide electric power supply via the further stack connection elements 107. Hence, an electrically conductive connection with an electronic periphery of the component carrier 100 can be provided. In particular, an electric connection with an electric power supply can be formed.

The first active component 110 is only mounted on the interposer 115 without being mounted on and connected to the stack 101. Specifically, the first active component 110 may be arranged within a cavity 108. The cavity 108 is formed by respective layer structures 103, 104 surrounding the interposer 115, wherein the interposer 115 is recessed with respect to the surrounding layer structures 103, 104 of the stack 101. The cavity 108 forms a recess with respect to the surface of the first main surface 111 of the stack 101 surrounding the cavity 108. The cavity 108 is formed in such a way, that the first active component 110 can be placed inside the cavity 108. The first active component 110 may protrude outside of the cavity 108 with respect to the stack main surface 111 surrounding the cavity 108.

At least one of the connection elements 116 of the interposer 115 is an electric connection element, in particular a copper structure. By providing a copper structure, the thermal behavior as well as the shielding capability may be improved. Furthermore, at least one of the connection elements 116 is an optical connection element, in particular an optical fiber or a light guide. The optical connection elements transmit signals/information via optical transmission.

The stack 101 and its first and second main surface 111, 121 as well as the interposer 115 and its first and second main surface 117, 118 extend within respective xy-planes. The z-direction is the direction of the normal of the respective xy-planes. Specifically, the z-direction defines a vertical direction of the stack 101. In particular, the vertical direction is the stacking direction of the stack 101. Hence, along the stacking direction the layer structures 103, 104 are stacked.

The interposer 115 has a higher density of connection elements 116 than e.g. connection elements 107, 109 of the stack 101 in z-direction. The interposer connection elements 116 connect a first active component 110 and the second active component 120. Specifically, the interposer connection elements 116 extend along a vertical direction (along the z-axis) of the interposer 115. As can be taken from the exemplary embodiment shown in FIG. 1, the interposer 115 has a higher density (per volume or per area) of connection elements 116 arranged in a vertical direction than the density of respective vertically arranged connection elements (connections 109 to stack and/or vias 107) of the stack 101.

The first active component 110 in the exemplary embodiment shown in FIG. 1 may be a memory and the second active component 120 may be a processor. The processor and the memory are mounted to one common interposer 115 of a component carrier 100 instead of separate packages onto a base structure 130, e.g. a mainboard.

The interposer 115 may be manufactured based on silicon and the stack 101 with FR4 material for the electrically insulting layer structure 103.

FIG. 2 to FIG. 9 illustrate a manufacturing process of the component carrier 100 according to an exemplary embodiment of the present invention.

Figure 2:
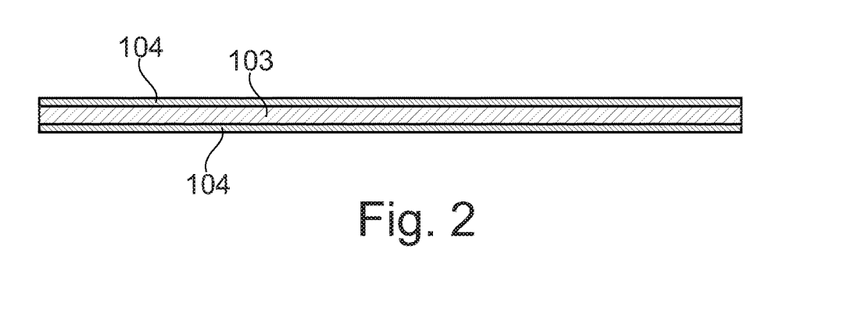
FIG. 2, FIG. 3, FIG. 4, FIG. 5, FIG. 6, FIG. 7, FIG. 8 and FIG. 9 illustrates a manufacturing of the component carrier according to an exemplary embodiment of the present invention.

FIG. 2 shows the formation of a core material comprising a central electrically insulating layer structure 103 being covered by respective layers of electrically conductive layer structures 104.

Figure 3:
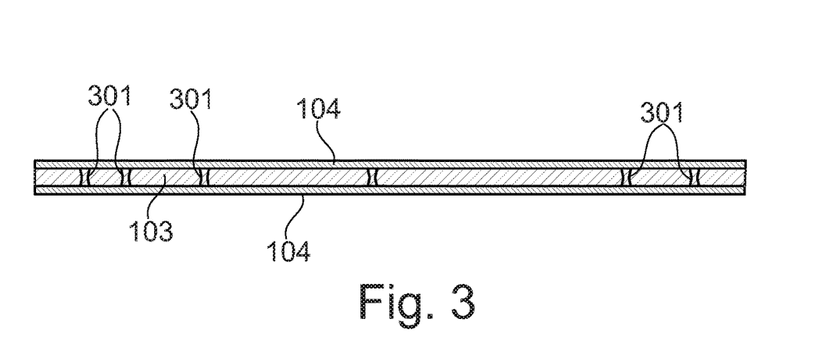

In a next step according to FIG. 3, through contacts 301 between the electrically conductive layer structures 104 are formed.

Figure 4:
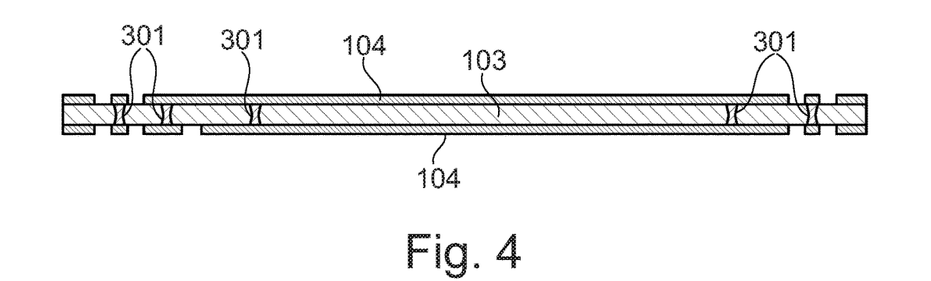

In a next step according to FIG. 4, the electrically conductive layer structures 104 are structured in order to provide a desired electrical path and connection scheme, respectively, through the core material.

Figure 5:
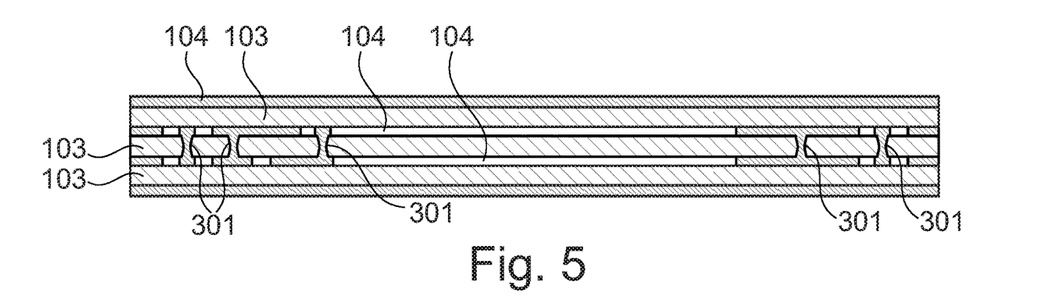

In a next step according to FIG. 5, additional further electrically insulating layer structures 103 and electrically conductive layer structures 104 can be added in the periphery of the through hole 102.

Figure 6:
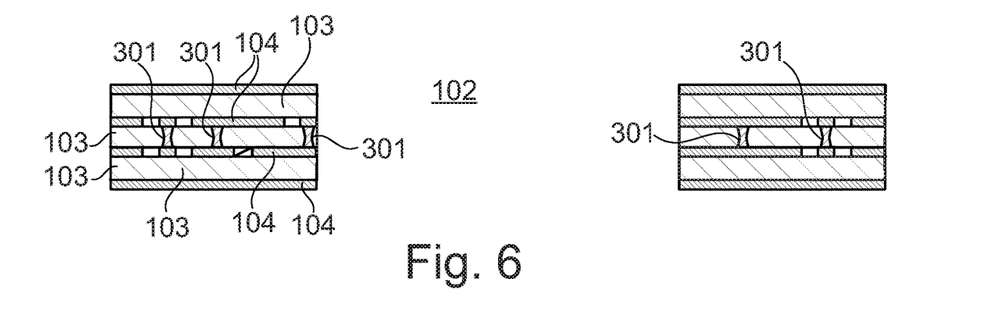

In a next step according to FIG. 6, the through hole 102 is formed through the insulating layer structure 103 and electrically conductive layer structures 104.

Figure 7:
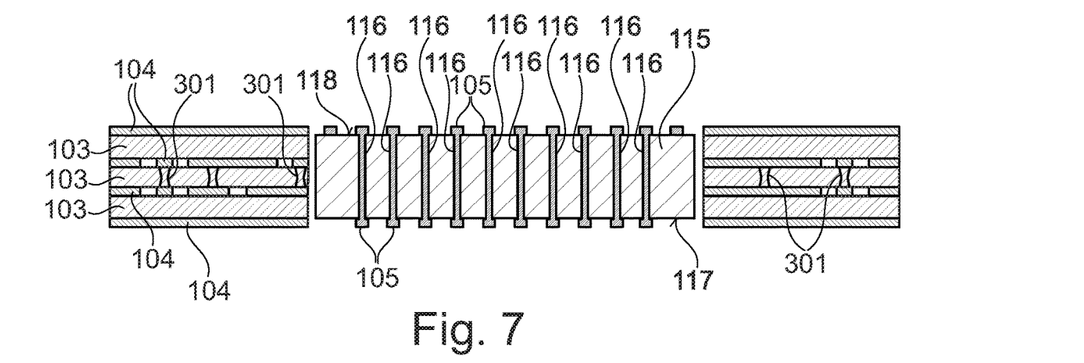

In a next step according to FIG. 7, the interposer 115 is arranged within the through hole 102. The interposer 115 already comprises connection elements 116 connecting two opposed main surfaces 117, 118 of the interposer 115. The embedded/integrated interposer (e.g. made of silicon) comprises the interposer connection elements 116 (functioning as a through silicon via (TSV)). In a subsequent step, the layer structures 103, 104 and the interposer 115 are laminated together (e.g. by applying heat and pressure) to form the component carrier 100. Furthermore, the interposer 115 may be glued (e.g. by inkjet or dispensing technology) within the through hole 102 to the component carrier 100.

Figure 8:
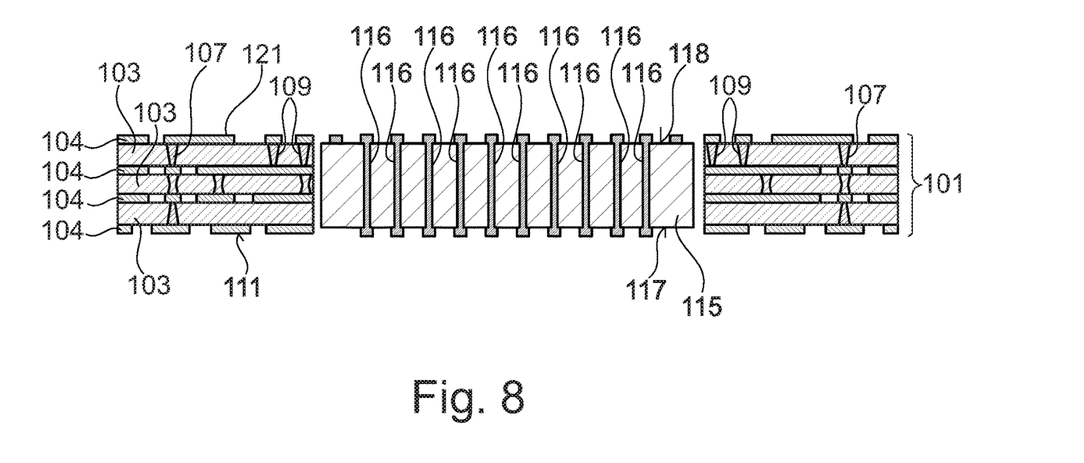

In a next step according to FIG. 8, the previously added electrically conductive layer structures 104 are structured in order to provide a desired electrical path. In this state, the stack 101 comprises the vias 107 and the respective connections 109 to the stack, to which the respective active component 110, 120 can be mounted in the next step.

Figure 9:
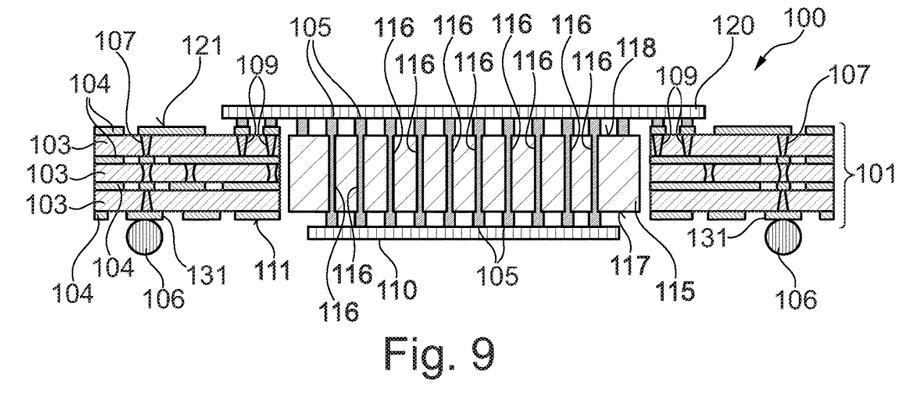

In a next step according to FIG. 9, the first active component 110 is mounted to the first main surface 117 of the interposer 115 and connected to the connection elements 116 by respective contacts/connections 105, such as solder pads or light guides. Accordingly, the second active component 120 is mounted to the second main surface 118 of the interposer 115 and connected to the connection elements 116 by respective contacts/connections 105, such as solder pads or light guides. The second active component 120 is further connected by connections 109 to the stack 101. Furthermore, solder balls 106 are added to the respective contacts or pads 131 and electrically conductive layer structures 104 of the component carrier 100.

Figure 10:
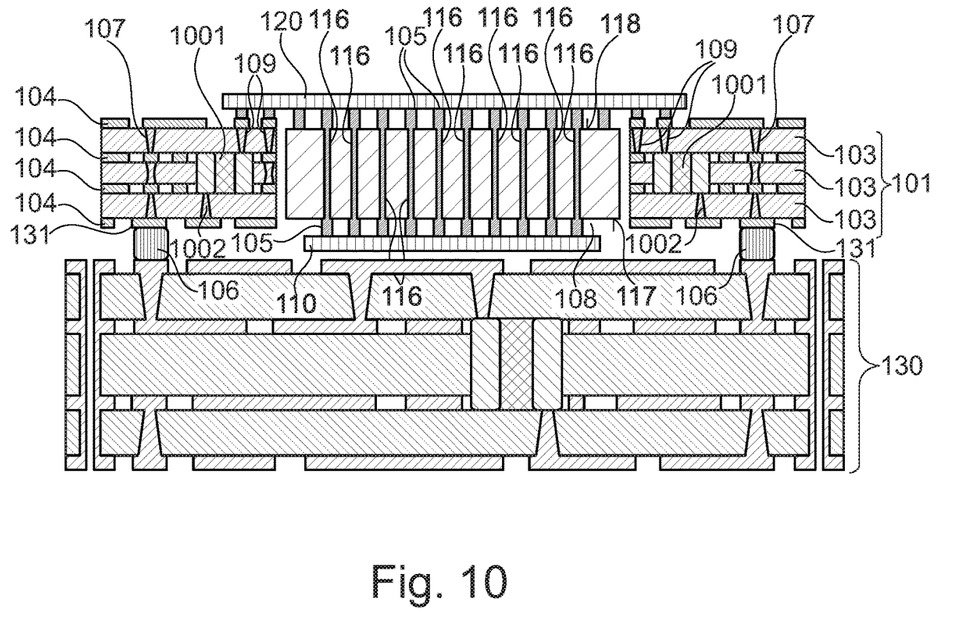
FIG. 10 illustrates a component carrier mounted to a support structure having a further active and/or passive component(s) according to an exemplary embodiment of the present invention.

In a next step, after the step of mounting the first active component 110 and the second active component 120 to the interposer 115 and stack 101, the component carrier 100 can be mounted to the support structure 130 according to FIG. 1 or FIG. 10.

The component carrier 100 forms a structurally independent unit, so that the active components 110, 120 and the interposer 115 mounted to the component carrier 100 and which collaborate functionally with each other can be tested separately without being mounted to a further support structure 130. Hence, after completely testing the component carrier 100 further mounting is provided. This supports the common chip-last technology, for example.

FIG. 10 shows a component carrier 100 mounted on a support structure 130. The arrangement shown in FIG. 10 is similar to the one in FIG. 1. Additionally, further active or passive components 1001 are embedded and integrated within the stack 101 surrounding the interposer 115. The further active and/or passive component 1001 is configured for collaborating functionally with at least the one of the first active component 110 and the second active component 120. The further active and/or passive component 1001 is connected for example by a connection or via 109, 1002 to the first or second active component 110, 120 or to a desired electrically insulating layer structure 104.

It should be noted that the term "comprising" does not exclude other elements or steps and the articles "a" or "an" do not exclude a plurality. Also, elements described in association with different embodiments may be combined. Implementation of the invention is not limited to the preferred embodiments shown in the figures and described above. Instead, a multiplicity of variants are possible which use the solutions shown and the principle according to the invention even in the case of fundamentally different embodiments.

REFERENCE NUMERALS 100 component carrier
101 stack
102 cavity
103 insulating layer structure
104 conductive layer structure
105 contact
106 solder ball
107, 109 connection elements
108 contact hole
110 first active component
111 first main surface
115 interposer
116 connection elements
117 first main surface
118 second main surface
120 second active component
121 second main surface
130 support structure
131 connection element
301 through contact
1001 further active or passive component
1002 further via

The invention claimed is:

1. A component carrier, comprising:
a laminated stack comprising at least one electrically insulating layer structure and at least two electrically conductive layer structures and having a through hole extending from a first main surface of the stack to a second main surface of the stack;

an interposer in the through hole and having a higher density of connection elements than the stack;

a first active component mounted on a first main surface of the interposer; and a second component mounted on a second main surface of the interposer and being connected to the first active component via the interposer;

wherein at least one of the first active component and the second component directly oppose the interposer, wherein the second component is directly connected with the interposer and the stack;

wherein the second component forms a top chip, extends over edges of the interposer, and extends over a section of the second main surface of the stack surrounding the interposer;

wherein the electrically insulating layer structure comprises an organic material, wherein said electrically insulating layer structure is cured against and between the two adjacent electrically conductive layer structures.

2. The component carrier according to claim 1, wherein a section of the stack surrounding the interposer comprises further stack connection elements between the first main surface of the stack and the second main surface of the stack to provide electric power supply via the further stack connection elements.

3. The component carrier according to claim 1, wherein at least one of the connection elements is an electric connection element.

4. The component carrier according to claim 1, wherein at least one of the connection elements is an optical connection element.

5. The component carrier according to claim 1, wherein the interposer has a higher density of connection elements than connection elements of the stack in z-direction.

6. The component carrier according to claim 1, wherein the interposer has a higher density of connection elements than connection elements of the stack in xy-plane.

7. The component carrier according to claim 1, wherein the first component and second component collaborate functionally.

8. The component carrier according to claim 1, wherein the second component is an active component.

9. The component carrier according to claim 8, wherein at least one of the first active component and the second active component is a semiconductor chip and/or wherein at least one of the first active component is a processor and the second active component is a memory.

10. The component carrier according to claim 1, wherein the interposer is manufactured based on glass, silicon, or ceramic materials.

11. The component carrier according to claim 8, wherein the first active component and/or the second active component is embedded in a cavity defined by the stack and the interposer.

12. The component carrier according to claim 8, wherein at least one further active and/or a passive component is surface-mounted on and/or embedded in the stack and/or the interposer.

13. A method of manufacturing a component carrier, the method comprising:

providing a laminated stack, comprising at least one electrically insulating layer structure and at least two electrically conductive layer structures, with a through hole extending from a first main surface of the stack to a second main surface of the stack;

arranging an interposer, having a higher density of connection elements than the stack, in the through hole;

mounting a first active component on a first main surface of the interposer; and mounting a second active component on a second main surface of the interposer to thereby connect the second active component with the first active component via the interposer, wherein the second active component is directly connected with the interposer and the stack, wherein the second active component forms a top chip, extends over edges of the interposer, and extends over a section of the second main surface of the stack surrounding the interposer, wherein the electrically insulating layer structure comprises an organic material, wherein said electrically insulating layer structure is cured against and between the two adjacent electrically conductive layer structures.

14. An electric device, comprising:

a support structure;

a component carrier mounted on the support structure, wherein the component carrier includes a laminated stack comprising at least one electrically insulating layer structure and at least two electrically conductive layer structures and having a through hole extending from a first main surface of the stack to a second main surface of the stack;

an interposer in the through hole and having a higher density of connection elements than the stack;

a first active component mounted on connection elements of the interposer, the first active component directly opposing a first main surface of the interposer; and a second component mounted on the connection elements of the interposer, the second component directly opposing a second main surface of the interposer and being connected to the first active component via the interposer, wherein the second component is directly connected with the interposer and the stack;

wherein the second component forms a top chip, extends over edges of the interposer, and extends over a section of the second main surface of the stack surrounding the interposer, wherein the electrically insulating layer structure comprises an organic material, wherein said electrically insulating layer structure is cured against and between the two adjacent electrically conductive layer structures.

* * * * *